(12) United States Patent
Ema et al.

(10) Patent No.: US 11,411,576 B2
(45) Date of Patent: Aug. 9, 2022

(54) DATA MANAGEMENT SYSTEM, DATA MANAGEMENT METHOD, AND STORAGE MEDIUM WITH DATA MANAGEMENT PROGRAM STORED THEREON

(71) Applicant: YOKOGAWA ELECTRIC CORPORATION, Tokyo (JP)

(72) Inventors: Nobuaki Ema, Tokyo (JP); Yoshitaka Yoshida, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 17/214,927

(22) Filed: Mar. 29, 2021

(65) Prior Publication Data
US 2021/0305998 A1 Sep. 30, 2021

(30) Foreign Application Priority Data

Mar. 31, 2020 (JP) .............................. JP2020-063822

(51) Int. Cl.
| | | |
|---|---|---|
| H03M 7/30 | (2006.01) | |
| H03M 7/46 | (2006.01) | |
| G06F 16/174 | (2019.01) | |
| G06F 16/215 | (2019.01) | |
| G06F 16/21 | (2019.01) | |

(52) U.S. Cl.
CPC ...... H03M 7/3062 (2013.01); G06F 16/1744 (2019.01); G06F 16/215 (2019.01); G06F 16/219 (2019.01); H03M 7/46 (2013.01)

(58) Field of Classification Search
CPC ..... H03M 7/3062; H03M 7/46; G06F 16/215; G06F 16/1744; G06F 16/219
USPC .......................................................... 341/50
See application file for complete search history.

(56) References Cited

U.S. PATENT DOCUMENTS

| | | | |
|---|---|---|---|
| 8,462,681 B2 * | 6/2013 | Pochiraju | .............. H04L 67/125 370/465 |
| 10,614,037 B2 * | 4/2020 | Dain | ................... G06F 16/1744 |
| 2003/0154056 A1 | 8/2003 | Ito | |
| 2017/0109377 A1 | 4/2017 | Baer | |
| 2018/0348734 A1 | 12/2018 | Berlier | |

FOREIGN PATENT DOCUMENTS

| | | |
|---|---|---|
| JP | H0254671 A | 2/1990 |
| JP | H06214637 A | 8/1994 |
| JP | H0829203 A | 2/1996 |

(Continued)

OTHER PUBLICATIONS

Office Action issued for counterpart Japanese Application No. 2020-063822, issued by the Japan Patent Office dated Feb. 8, 2022 (drafted on Jan. 28, 2022).

(Continued)

*Primary Examiner* — Khai M Nguyen

(57) ABSTRACT

Provided is a data management system which includes a data acquisition unit configured to acquire measurement data obtained by measuring a measurement target, a data storage unit configured to store the acquired measurement data, a data size reduction unit configured to deletes at least a part of the stored measurement data to reduce a data size of the measurement data, and a data compression unit configured to perform data compression on the measurement data reduced in data size.

20 Claims, 9 Drawing Sheets

(56) References Cited

FOREIGN PATENT DOCUMENTS

| JP | 2006115412 A | 4/2006 |
| JP | 2010230330 A | 10/2010 |
| JP | 2011010320 A | 1/2011 |
| JP | 2017146886 A | 8/2017 |

OTHER PUBLICATIONS

Extended European Search Report for counterpart European Application No. 21163202.1, issued by the European Patent Office dated Aug. 4, 2021.
Office Action for European Patent Application No. 21163202.1, issued by the European Patent Office dated Mar. 28, 2022.

* cited by examiner

| TIME | T1 | T2 | T3 | T4 | T5 | T6 | T7 | T8 | T9 | T10 | T11 | T12 | T13 | T14 |
|---|---|---|---|---|---|---|---|---|---|---|---|---|---|---|
| SENSOR A | X | X | X | X | X | Y | X | X | X | Z | Z | Z | Y | Y |
| SENSOR B | OFF | OFF | OFF | ON | OFF | OFF | OFF | OFF | OFF | OFF | ON | ON | ON | ON |
| SENSOR C | 12 | 12 | 12 | 13 | 12 | 12 | 12 | 13 | 12 | 12 | 16 | 20 | 24 | 28 |
| SENSOR D | 1.34 | 1.32 | 1.33 | 1.34 | 1.33 | 1.34 | 1.56 | 1.64 | 1.61 | 1.83 | 1.83 | 1.84 | 1.84 | 1.82 |

*FIG. 2*

| TIME | T1 | T2 | T3 | T4 | T5 | T6 | T7 | T8 | T9 | T10 | T11 | T12 | T13 | T14 |
|---|---|---|---|---|---|---|---|---|---|---|---|---|---|---|
| SENSOR B | OFF | OFF | OFF | ON | OFF | OFF | OFF | OFF | OFF | OFF | ON | ON | ON | ON |

DATA COMPRESSION ↓

3164

DECOMPRESSION ↓

00010000001111

DATA SIZE REDUCTION ↓

0000011

DATA COMPRESSION ↓

| TIME | T1 | T2 | T3 | T4 | T5 | T6 | T7 | T8 | T9 | T10 | T11 | T12 | T13 | T14 |
|---|---|---|---|---|---|---|---|---|---|---|---|---|---|---|
| SENSOR C | 12 | 12 | 12 | 13 | 12 | 12 | 12 | 13 | 12 | 12 | 16 | 20 | 24 | 28 |

DATA COMPRESSION ↓

"12"3, "13", "12"3, "13", "12"2, "16", "20", "24", "28"

DECOMPRESSION ↓

12, 12, 12, 13, 12, 12, 12, 13, 12, 12, 16, 20, 24, 28

DATA SIZE REDUCTION ↓

12, 12, 12, 24

DATA COMPRESSION ↓

| TIME | T1 | T2 | T3 | T4 | T5 | T6 | T7 | T8 | T9 | T10 | T11 | T12 | T13 | T14 |
|---|---|---|---|---|---|---|---|---|---|---|---|---|---|---|
| SENSOR D | 1.34 | 1.32 | 1.33 | 1.34 | 1.33 | 1.34 | 1.56 | 1.64 | 1.61 | 1.83 | 1.83 | 1.84 | 1.84 | 1.82 |

DATA COMPRESSION ↓

"1.34","1.32","1.33" "1.34","1.33","1.34","1.56","1.64","1.61","1.83"2,"1.84"2,"1.82

DECOMPRESSION ↓

1.34, 1.32, 1.33, 1.34, 1.33, 1.34, 1.56, 1.64, 1.61, 1.83, 1.83, 1.84, 1.84, 1.82

DATA SIZE REDUCTION ↓

1.3, 1.3, 1.3, 1.3, 1.3, 1.3, 1.6, 1.6, 1.6, 1.8, 1.8, 1.8, 1.8, 1.8

DATA COMPRESSION ↓

DATA MANAGEMENT SYSTEM, DATA MANAGEMENT METHOD, AND STORAGE MEDIUM WITH DATA MANAGEMENT PROGRAM STORED THEREON

The contents of the following Japanese patent application (s) are incorporated herein by reference:
NO. 2020-063822 filed in JP on Mar. 31, 2020

BACKGROUND

1. Technical Field

The present invention relates to a data management system, a data management method, and a storage medium having stored thereon a data management program.

2. Related Art

In Patent Literature 1, it is described that "the out-of-date monitoring data among the stored monitoring data is stored by ½ of the full rate". Citation List Patent Literature
Patent Literature 1: Japanese Patent Application Publication No. 2006-115412

SUMMARY

In a first aspect of the invention, a data management system is provided. The data management system may include a data acquisition unit configured to acquire measurement data obtained by measuring a measurement target. The data management system may include a data storage unit configured to store the acquired measurement data. The data management system may include a data size reduction unit configured to delete at least a part of the stored measurement data to reduce the data size of the measurement data. The data management system may include a data compression unit configured to perform data compression on the measurement data reduced in data size.

The data compression unit may be configured to losslessly compress the measurement data reduced in data size.

The data management system may further include a data decompression unit configured to decompress the stored measurement data before the data size of the stored measurement data is reduced.

The data size reduction unit may be configured to reduce the number of samples of the stored measurement data.

The data size reduction unit may be configured to reduce the bit width of the stored measurement data.

The data size reduction unit may be configured to reduce the data size of the measurement data in accordance with elapse of a predetermined time.

The predetermined time may be an elapsed time after the measurement data has been stored.

The predetermined time may be an elapsed time after the measurement data has been last accessed.

The predetermined time may be set to a value that is different for each measurement data.

The data management system may further include a data transmission unit configured to transmit the measurement data after the data compression to other systems or devices.

In a second aspect of the invention, a data management method is provided. The data management method may include acquiring the measurement data obtained by measuring the measurement target. The data management method may include storing the acquired measurement data. The data management method may include deleting at least a part of the stored measurement data to reduce the data size of the measurement data. The data management method may include performing data compression on the measurement data reduced in data size.

In a third aspect of the invention, a storage medium having stored thereon a data management program is provided. The data management program may be executed by a computer. The data management program may cause the computer to function as a data acquisition unit configured to acquire the measurement data obtained by measuring the measurement target. The data management program may cause the computer to function as a data storage unit configured to store the acquired measurement data. The data management program may cause the computer to function as a data size reduction unit configured to delete at least a part of the stored measurement data to reduce the data size of the measurement data. The data management program may cause the computer to function as a data compression unit configured to perform data compression on the measurement data reduced in data size.

The summary clause does not necessarily describe all necessary features of the embodiments of the present invention. The present invention may also be a sub-combination of the feature groups described above.

BRIEF DESCRIPTION OF THE DRAWINGS

FIG. 2 illustrates an exemplary measurement data acquired by the data management system 100 according to this embodiment.

FIG. 5 illustrates a diagram illustrating an exemplary measurement data from a sensor B in a case where the data management system 100 according to this embodiment reduces the data size to perform data compression.

FIG. 6 illustrates a diagram illustrating an exemplary measurement data from a sensor C in a case where the data management system 100 according to this embodiment reduces the data size to perform data compression.

FIG. 7 illustrates a diagram illustrating an exemplary measurement data from a sensor D in a case where the data management system 100 according to this embodiment reduces the data size to perform data compression.

DESCRIPTION OF EXEMPLARY EMBODIMENTS

Hereinafter, the invention will be described through embodiments, but the following embodiments do not limit the invention according to the claims. In addition, not all of the combinations of features described in the embodiments are essential to the solving means of the invention.

Figure 1:
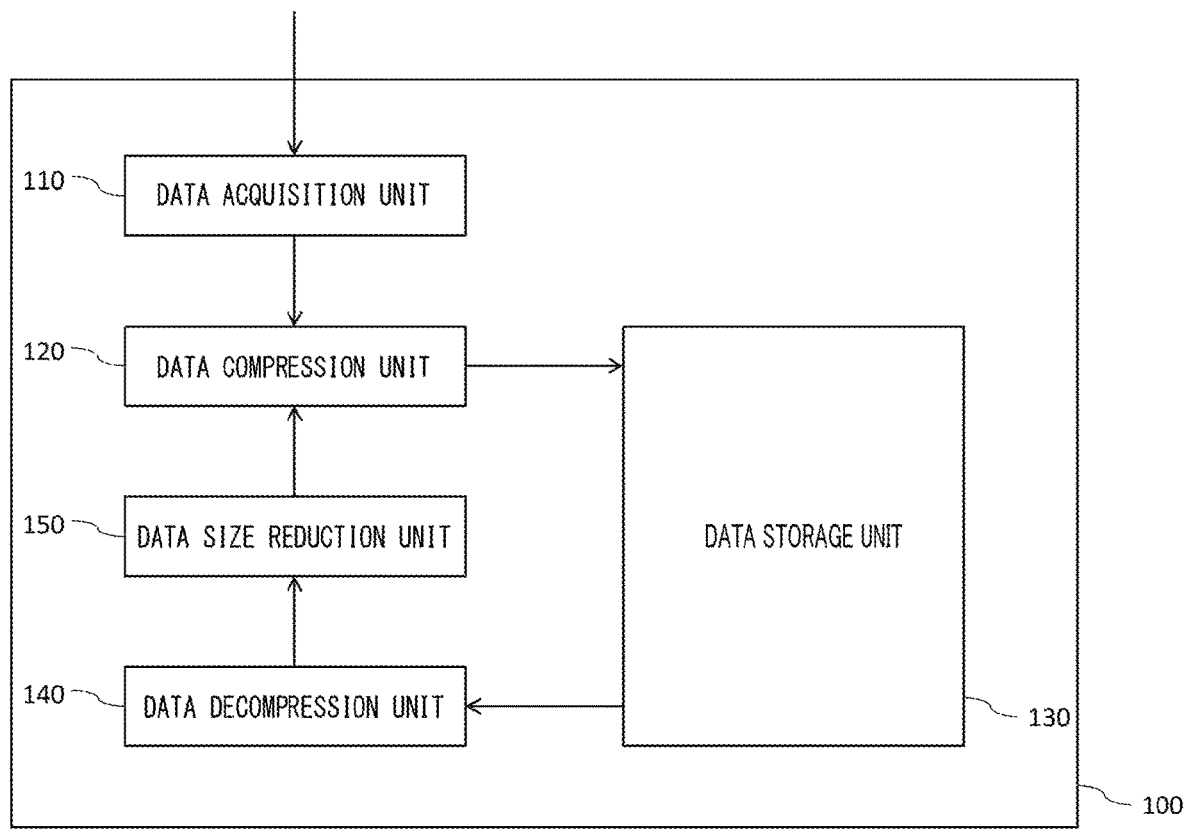
FIG. 1 illustrates an exemplary block diagram of a data management system 100 according to this embodiment.

FIG. 1 illustrates an exemplary block diagram of a data management system 100 according to this embodiment. The data management system 100 according to this embodiment acquires and stores measurement data which obtained by measuring a measurement target. Then, the data management system 100 deletes a part of the stored measurement data to reduce the data size, and then performs data compression on the measurement data.

In this embodiment, a case where the data management system 100 handles the measurement data acquired from a plurality of sensors provided in a plant as a management target will be shown as an example. However, the invention is not limited thereto. The data management system 100 may handle data from one or more sensors provided at any locations that are different from the plant as a management target.

The data management system 100 may be a computer such as a PC (personal computer), a tablet computer, a smart phone, a workstation, a server computer, or a general purpose computer, or may be a computer system connected to a plurality of computers. Such a computer system is also a computer in a broad sense. In addition, the data management system 100 may be installed in one or more virtual computer environment that can run in a computer. Alternatively, the data management system 100 may be a dedicated computer designed for data management, or may be a dedicated hardware realized by a dedicated circuit. In addition, in a case where the data management system 100 can be connected to the Internet, the data management system 100 may be realized by cloud computing.

The data management system 100 includes a data acquisition unit 110, a data compression unit 120, a data storage unit 130, a data decompression unit 140, and a data size reduction unit 150. Note that these blocks may be functional blocks which are functionally separated from each other, and may not necessarily coincide with the actual device configuration. In other words, a block may not necessarily be composed of one device just because the block is shown as one block in this drawing. In addition, the blocks each may not necessarily be composed of separate devices just because the blocks are shown as separate blocks in this drawing.

The data acquisition unit 110 acquires the measurement data obtained by measuring the measurement target. As an example, the data acquisition unit 110 may be a communication unit, and for example, acquires the measurement data obtained by measuring the measurement target via a communication network from each of a plurality of sensors in a chronological order.

Such a communication network may be a network that connects a plurality of computers. For example, the communication network may be a global network in which a plurality of computer networks are connected to each other. For example, the communication network may be the Internet or the like using an Internet protocol. Alternatively, the communication network may be realized by a dedicated line. In other words, the data acquisition unit 110 can also communicate directly or indirectly data with a mobile phone, a smart phone, a fourth-generation (4G) terminal, a fifth-generation (5G) terminal and the like to acquire measurement data.

In the above description, a case where the data acquisition unit 110 acquires the measurement data from each of the plurality of sensors via the communication network has been described as an example, but the invention is not limited thereto. The data acquisition unit 110 may acquire the measurement data from each of the plurality of sensors via other means which is different from the communication network, such as a user input or various types of memory devices.

Herein, such the plurality of sensors can acquire the measurement data obtained by measuring the measurement target. The plurality of sensors may be, for example, a sensor installed in an OT (Operational Technology) region (for example, a sensor for process control (measurement)) or an IoT (Internet of Things) sensor. As an example, the plurality of sensors may be industrial sensors that are connected to or integrally formed with one or more field devices installed in a plant.

Herein, in addition to an industrial plant such as a chemical plant, such a plant may be, for example, a plant for managing and controlling a well source such as a gas field or an oil field and the surroundings thereof, a plant for managing and controlling power generation such as hydropower, thermal power, nuclear power, or the like, a plant for managing and controlling environmental power generation such as solar power, wind power, or the like, and a plant for managing and controlling water and sewage, dams, or the like.

In addition, the field device installed in such a plant may be, for example, a sensor such as a pressure gauge, a flow meter, a temperature sensor, or the like, a valve device such as a flow control valve, an opening/closing valve, or the like, an actuator device such as a fan, a motor, or the like, an imaging device such as a camera or a video for capturing a situation or an object in the plant, an audio device such as a microphone, a speaker, or the like which collects abnormal noise in the plant or issues an alarm, and a position detection device for outputting position information of each device.

Therefore, the data acquisition unit 110 may acquire, from each of the plurality of field devices, for example, the measurement data measured by the sensor itself and measurement data measured inside the field device, such as temperature, voltage, flow rate, acceleration, magnetic field, position, camera image, ON/OFF data of a switch, sound, and a combination thereof as the measurement data. In addition, the data acquisition unit 110 may acquire a value generated using a numerical expression based on these pieces of data as the measurement data. The data acquisition unit 110 supplies the measurement data acquired from each of the plurality of sensors to the data compression unit 120. Note that in the above description, a case where the data acquisition unit 110 supplies the acquired measurement data to the data compression unit 120 has been shown as an example, but the invention is not limited thereto. The data acquisition unit 110 may supply the acquired measurement data to the data storage unit 130.

The data compression unit 120 performs data compression on the measurement data supplied from the data acquisition unit 110. In addition, the data compression unit 120 performs data compression on the measurement data reduced in data size supplied from the data size reduction unit 150, as described later. At this time, the data compression unit 120 may losslessly compress (lossless compression) the measurement data reduced in data size.

Herein, the lossless compression is a data compression method in which the data before compression and the data subjected to compression/decompression (also called "expansion" and "extraction") are completely equal. Such a lossless compression algorithm includes, for example, a run length encoding (RLE). The run length encoding is an algorithm that compresses data by representing a series of data with one piece of data and a length of continuation thereof. Hereinafter, a case where the data compression unit 120 uses the run length encoding as a compression algorithm will be described as an example, but the invention is not limited thereto. The data compression unit 120 may use other compression algorithms that are different from the run length encoding, for example, Huffman code, LZW (Lempel-Ziv-Welch), and the like. The data compression unit 120 supplies the compressed measurement data to the data storage unit 130.

The data storage unit 130 stores the measurement data. As an example, the data storage unit 130 may store, for each sensor, the compressed measurement data supplied from the data compression unit 120. Alternatively, or in addition, the data storage unit 130 may store, for each sensor, the raw measurement data acquired by the data acquisition unit 110.

The data decompression unit 140 decompresses the stored measurement data before reducing the data size of the stored measurement data. As an example, the data decompression unit 140 reads out the measurement data that has been losslessly compressed by the data compression unit 120 from the data storage unit 130 at a predetermined timing. Then, the data decompression unit 140 decompresses the losslessly compressed measurement data according to the compression algorithm used by the data compression unit 120. In other words, the data decompression unit 140 restores the measurement data before the data compression by the data compression unit 120. The data decompression unit 140 supplies the decompressed measurement data to the data size reduction unit 150.

The data size reduction unit 150 deletes at least a part of the stored measurement data to reduce the data size of the measurement data. As an example, the data size reduction unit 150 deletes at least a part of the decompressed measurement data which is supplied from the data decompression unit 140 to reduce the data size of the measurement data. At this time, the data size reduction unit 150 may reduce, for example, the number of samples of the measurement data, or may reduce the bit width of the measurement data. Note that, in a case where data size is reduced in this way by deleting a part of the data, when the data is restored, the data before the reduction will not be completely restored. In other words, it can be said that the data size reduction unit 150 lossily compresses the measurement data (that is, lossy compression). The data size reduction unit 150 supplies the measurement data reduced in data size to the data compression unit 120.

Then, the data compression unit 120 performs data compression on the measurement data reduced in the data size. As an example, the data compression unit 120 compresses the measurement data reduced in data size, which is supplied from the data size reduction unit 150, by the run length encoding similarly to the measurement data supplied from the data acquisition unit 110. The data compression unit 120 supplies, to the data storage unit 130, the measurement data which has been compressed after being reduced in data size in this way. Then, the data storage unit 130 rewrites the stored measurement data to the measurement data which has been compressed after being reduced in data size. In the above description, a case where the data management system 100 reads out the measurement data from the data storage unit 130, and overwrites the measurement data stored in the data storage unit 130 with the measurement data which has been decompressed, reduced in data size, and compressed has been shown as an example. However, the invention is not limited thereto. The data management system 100 may take out the measurement data itself, which has been stored in the data storage unit 130, from a storage area, perform decompression, reduction in data size, and data compression thereon, and rewrite the data in the data storage unit 130. In this way, the data storage unit 130 updates the stored measurement data to the measurement data that has been compressed after being reduced in data size, and stores this again.

FIG. 2 shows an exemplary measurement data which is acquired by the data management system 100 according to this embodiment. In this drawing, a case where the data management system 100 acquires the measurement data from four sensors, that is, a sensor A, a sensor B, a sensor C, and a sensor D. However, the invention is not limited thereto. The data management system 100 may acquire the measurement data from a plurality of sensors more than four, or may acquire the measurement data from one or more sensors less than four.

Herein, the types of the plurality of sensors may be the same. In other words, all of the sensors A to D may be able to acquire the same type of the measurement data. Alternatively, some or all of the types of the plurality of sensors may be different. In other words, some of the sensors A to D may be able to acquire different types of the measurement data, or all of the sensors A to D may be able to acquire different types of the measurement data.

In this drawing, the measurement data from the sensor A, the sensor B, the sensor C, and the sensor D in a predetermined period is shown in a chronological order from Time T=1 to Time T=14 in order from the top. In this drawing, a case where the data management system 100 acquires the measurement data from all the sensors in synchronization with time is shown as an example. However, the invention is not limited thereto. The data management system 100 may asynchronously acquire the measurement data from at least some of the plurality of sensors. Herein, the measurement data from the sensor A may be, for example, data indicating a plurality of states (X, Y, and Z) in a chronological order. In addition, the measurement data from the sensor B may be, for example, data indicating the OFF/ON of a switch in a chronological order. In addition, the measurement data from the sensor C may be, for example, time series data consisting of integer values. In addition, the measurement data from the sensor D may be, for example, time series data consisting of second-largest fractional values.

The data management system 100 according to this embodiment acquires and stores, for example, the measurement data as shown in this drawing. Then, the data management system 100 deletes a part of the stored measurement data to reduce the data size, and then performs data compression on the measurement data. This will be described in detail using a flow.

Figure 3:
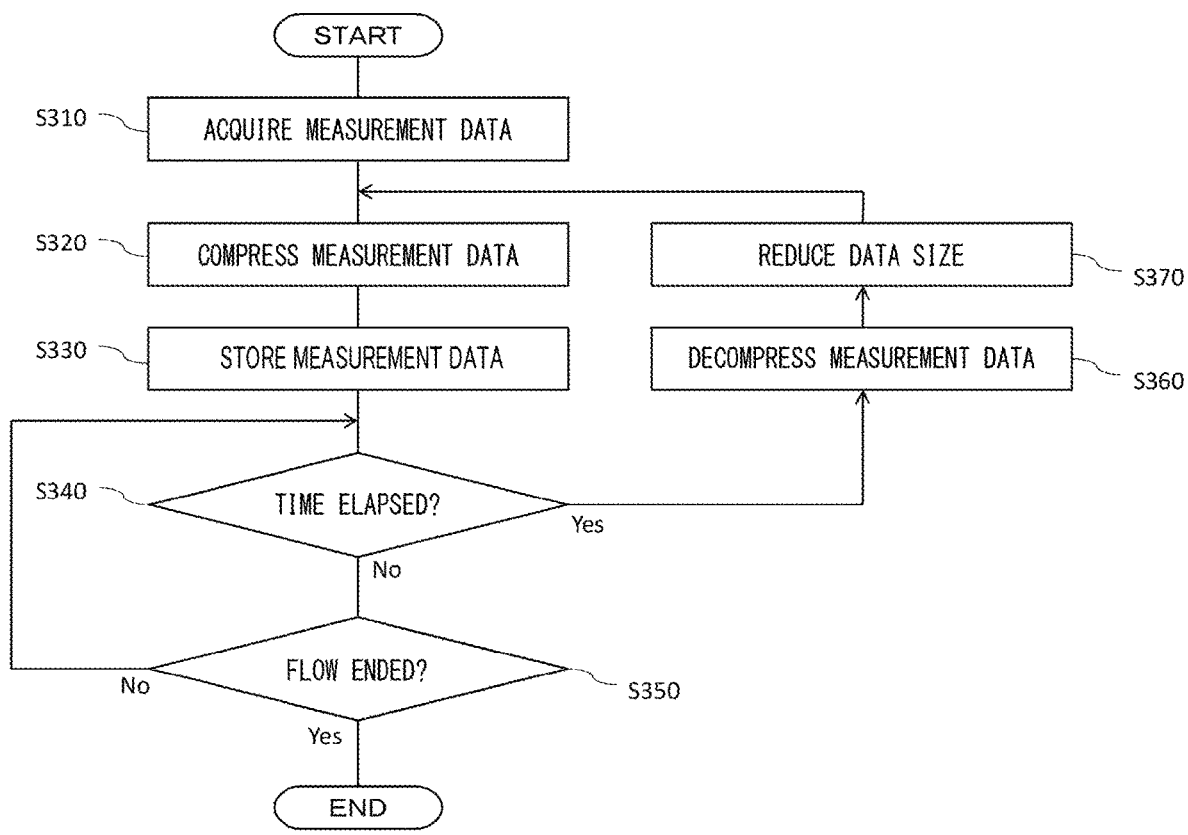
FIG. 3 illustrates a diagram illustrating an exemplary flow in which the data management system 100 according to this embodiment reduces a data size of the measurement data to compress the data.

FIG. 3 shows an exemplary flow of data compression in which the data management system 100 according to this embodiment reduces the data size of the measurement data to compress the data.

In Step 310, the data management system 100 acquires the measurement data which has been obtained by measuring the measurement target. As an example, the data acquisition unit 110 acquires the measurement data obtained by measuring the measurement target in a chronological order from the plurality of sensors (for example, the sensor A, the sensor B, the sensor C, and the sensor D) via the communication network. For example, the data acquisition unit 110 acquires a data array "XXXXXYXXXZZZYY" as the measurement data from the sensor A from Time T=1 to Time T=14. The data acquisition unit 110 supplies the measurement data acquired from each of the plurality of sensors to the data compression unit 120.

In Step 320, the data management system 100 performs data compression on the measurement data. As an example, the data compression unit 120 performs data compression on the measurement data acquired in Step 310. At this time, the data compression unit 120 may losslessly compress the measurement data acquired in Step 310. For example, the data compression unit 120 may perform the run length encoding on the data array "XXXXXYXXXZZZYY" to obtain the data array "'X'5, 'Y', 'X'3, 'Z'3, 'Y'2". This indicates that "X" is repeated 5 times, followed by "Y" once, followed by "X" repeated 3 times, followed by "Z" repeated 3 times, and followed by "Y" repeated 2 times. The data compression unit 120 supplies the measurement data compressed in this way to the data storage unit 130.

In Step 330, the data management system 100 stores the measurement data. As an example, the data storage unit 130 stores the measurement data compressed in Step 320 for each sensor in a chronological order.

In Step 340, the data management system 100 determines whether a predetermined time has elapsed. Such a predetermined time may be, for example, an elapsed time after the measurement data has been stored in Step 330. Alternatively or in addition, the predetermined time may be an elapsed time after the measurement data has been last accessed. In addition, such a predetermined time may be set to a value that is different for each measurement data. For example, the predetermined time may be set to a value different for each sensor. Alternatively or in addition, the predetermined time may be set to a value different for each period (Time m to Time n). In the above description, a case where the data management system 100 determines whether a predetermined time has elapsed has been described as an example. However, the invention is not limited thereto. The data management system 100 may determine the occurrence of other events different from the elapse of time, for example, whether the remaining storage capacity of the data storage unit 130 falls below a predetermined capacity.

In a case where it is determined that the predetermined time has not elapsed, the data management system 100 determines whether to end the flow in Step 350. The data management system 100 may, for example, determine whether to end the flow based on the elapsed time after starting the flow, the number of times the data size has been reduced, the amount of reduction of data size, the number of times the data has been compressed, and the presence/absence of exit instruction from a user. In a case where it is determined that the flow is to be ended, the data management system 100 ends the flow. On the other hand, in a case where it is determined that the flow is not to be ended, the data management system 100 returns the process to Step 340 and continues the flow.

In Step 340, in a case where it is determined that the predetermined time has elapsed, the data management system 100 decompresses the measurement data in Step 360. As an example, the data decompression unit 140 reads out the measurement data losslessly compressed in Step 320 from the data storage unit 130. Then, the data decompression unit 140 decompresses the losslessly compressed measurement data according to the compression algorithm used by the data compression unit 120 in Step 320. For example, the data decompression unit 140 reads out, from the data storage unit 130, the data array "'X'5, 'Y', 'X'3, 'Z'3, 'Y'2", which is stored as the measurement data from the sensor A. Then, the data decompression unit 140 decompresses the data array, and restores the original data array "XXXXXYXXXZZZYY". Before reducing the data size of the stored measurement data in this way, the data decompression unit 140 decompresses the stored measurement data. Then, the data decompression unit 140 supplies the decompressed measurement data to the data size reduction unit 150.

In Step 370, the data management system 100 deletes at least a part of the stored measurement data to reduce the data size of the measurement data. As an example, the data size reduction unit 150 deletes at least a part of the measurement data decompressed in Step 360 to reduce the data size of the measurement data. At this time, the data size reduction unit 150 may reduce the number of samples of the stored measurement data. As an example, for the measurement data from the sensor A, the data size reduction unit 150 may delete the data at the even-numbered time in the decompressed data array "XXXXXYXXXZZZYY" to obtain data array "XXXXXZY". Alternatively or in addition, the data size reduction unit 150 may reduce the bit width of the stored measurement data. As an example, for the measurement data from the sensor D, the data size reduction unit 150 may round off the second-largest fractional value to obtain time series data "1.3, 1.3, . . . , 1.6, 1.6, . . . , 1.8, 1.8" consisting of the first-largest fractional value. In the above description, a case where the rounding-off is used when the data size reduction unit 150 reduces the number of valid digits has been described as an example, but is not limited thereto. The data size reduction unit 150 may use a method that is different from the rounding-off, such as rounding down and rounding up. In addition, the data size reduction unit 150 may reduce the data size of the measurement data by reducing the number of bits for quantizing each of the measurement data having a dynamic range in a chronological order (for example, reducing the number of bits from 16 bits to 8 bits). In this way, the data size reduction unit 150 may lossily compress the measurement data by thinning the samples in the time axial direction or by reducing the bit width in the size axial direction (reducing the number of quantized bits). Thus, the data size reduction unit 150 reduces the data size of the measurement data in accordance with elapse of the predetermined time. The data size reduction unit 150 supplies the measurement data reduced in data size to the data compression unit 120. Then, the data management system 100 returns the process to Step 320, and continues the flow.

In other words, in Step 320 following Step 370, the data management system 100 performs data compression on the measurement data reduced in data size. As an example, the data compression unit 120 compresses the measurement data of which the data size has been reduced in Step 370, as in Step 320 following Step 310. For example, for the measurement data from the sensor A, the data compression unit 120 performs the run length encoding on the data array "XXXXXZY" which has been reduced in the data size in Step 370, to obtain data array "'X'5, 'Z', 'Y'". The data compression unit 120 supplies the measurement data which has been compressed after being reduced in data size to the data storage unit 130.

Then, in Step 330 following Step 370, the data management system 100 updates and stores the measurement data again. As an example, the data storage unit 130 updates the stored measurement data to the measurement data that has been compressed after being reduced in data size, and stores this again. For example, for the measurement data from the sensor A, the data storage unit 130 rewrites the data array "'X'5, 'Y', 'X'3, 'Z'3, 'Y'2" to the data array "'X'5, 'Z', 'Y'".

The data management system 100 repeats such processes until it is determined that the flow is to be ended in Step 350.

Figure 4:
FIG. 4 illustrates a diagram illustrating an exemplary measurement data from a sensor A in a case where the data management system 100 according to this embodiment reduces the data size to compress data.

FIG. 4 shows an exemplary measurement data from the sensor A in a case where the data management system 100 according to this embodiment reduces the data size to compress the data. It is assumed that the data management system 100 has acquired the data array shown in FIG. 2, for example, at Time T1 to T14 as the measurement data from the sensor A. In this case, the data management system 100 performs data compression on the acquired data array, and stores the compressed data array as the data array "'X'5, 'Y', 'X'3, 'Z'3, 'Y'2". Then, in a case where the predetermined time has elapsed, the stored data array is decompressed to obtain data array "XXXXXYXXXZZZYY". Then, the data management system 100 deletes the data at the even-numbered time in the decompressed data array to obtain the data array "XXXXXZY". Then, the data management system 100 performs data compression again on the data array reduced in data size so as to obtain the data array "'X'5, 'Z', 'Y'", and rewrites the stored measurement data to the data array.

FIG. 5 shows an exemplary measurement data from the sensor B in a case where the data management system 100 according to this embodiment reduces the data size to compress the data. It is assumed that the data management system 100 has acquired the data array shown in FIG. 2, for example, at Time T1 to T14 as the measurement data from the sensor B. In addition, here, it is assumed that it is already known that an initial state of the measurement data is OFF. In this case, the data management system 100 performs data compression on the acquired data array, and stores the compressed data array as the data array "3164". In this way, in a case where the measurement data is binary data and the initial value is already known, the data management system 100 may perform data compression to show only the number of data until the value (state) changes. Then, in a case where the predetermined time has been elapsed, the stored data array is decompressed to obtain the data array "00010000001111". Herein, "0" indicates an OFF state, and "1" indicates an ON state. Then, the data management system 100 deletes the data at the even-numbered time in the decompressed data array to obtain the data array "0000011". Then, the data management system 100 performs data compression again on the data array reduced in data size so as to obtain the data array "52", and rewrites the stored measurement data to the data array.

FIG. 6 shows an exemplary measurement data from the sensor C in a case where the data management system 100 according to this embodiment reduces the data size to compress the data. In the above description, a case where the data management system 100 reduces the data size of the measurement data by thinning the samples to be ½ in the time axial direction has been described as an example. However, the thinning rate of the samples may be any value. For example, the data management system 100 may reduce the data size of the measurement data by thinning the samples to be ¼ in the time axial direction. It is assumed that the data management system 100 has acquired the data array shown in FIG. 2, for example, at Time T1 to T14 as the measurement data from the sensor C. In this case, the data management system 100 performs data compression on the acquired data array, and stores the compressed data array as the data array "'12'3, '13', '12'3, '13', '12'2, '16', '20', '24', '28'". Then, in a case where the predetermined time has elapsed, the stored data array is decompressed to obtain the data array "12, 12, 12, 13, 12, 12, 12, 13, 12, 12, 16, 20, 24, 28". Then, the data management system 100 deletes the data at the time other than the 1st, 5th, 9th, and 13th time in the decompressed data array to obtain the data array "12, 12, 12, 24". Then, the data management system 100 performs data compression again on the data array reduced in data size so as to obtain the data array "'12'3, '24'", and rewrites the stored measurement data to the data array.

FIG. 7 shows an exemplary measurement data from the sensor D in a case where the data management system 100 according to this embodiment reduces the data size to compress the data. In the above description, a case where the data management system 100 reduces the data size of the measurement data by thinning the samples in the time axial direction has been described as an example. However, the data management system 100 may reduce the data size of the measurement data by coarsening the resolution in the size axial direction to reduce the number of quantized bits. It is assumed that the data management system 100 has acquired the data array shown in FIG. 2, for example, at Time T1 to T14 as the measurement data from the sensor D. In this case, the data management system 100 performs data compression on the acquired data array, and stores the compressed data array as the data array "'1.34', '1.32', '1.33', '1.34', '1.33', '1.34', '1.56', '1.64', '1.61', '1.83'2, '1.84'2, '1.82'". Then, in a case where the predetermined time has been elapsed, the stored data array is decompressed to obtain the data array "1.34, 1.32, 1.33, 1.34, 1.33, 1.34, 1.56, 1.64, 1.61, 1.83, 1.83, 1.84, 1.84, 1.82". Then, the data management system 100 reduces the number of valid digits with respect to each value of the decompressed data array (for example, the second-largest fractional value is rounded to be the first-largest fractional value) so as to obtain the data array "1.3, 1.3, 1.3, 1.3, 1.3, 1.3, 1.6, 1.6, 1.6, 1.8, 1.8, 1.8, 1.8, 1.8". Then, the data management system 100 performs data compression again on the data array reduced in data size so as to obtain the data array "1.3'6, '1.6'3, '1.8'5", and rewrites the stored measurement data to the data array.

For example, it is expected that the data size is explosively increased, for example, by combining a process control system in an operational technology (OT) domain with a system in an information technology (IT) domain or the like. In such a situation, it is not practical to store all data as it is, so there is a need to reduce the data size or make a selection. Conventionally, a data storage device has been known in which out-of-time monitoring data is stored by ½ the full rate thereof. However, the conventional data storage device only can secure the free space as much as the thinned data.

In this regard, the data management system 100 according to this embodiment deletes at least a part of the stored measurement data to reduce the data size, and then compresses the data. Thus, according to the data management system 100 of this embodiment, it is possible to secure the free space more than the deleted data size, and the measurement data can be efficiently managed.

In addition, the data management system 100 according to this embodiment losslessly compresses the measurement data reduced in data size. Thus, according to the data management system of this embodiment, by combining the lossless compression and the lossy compression, it is possible to secure the free space more than the deleted data size while being able to restore the measurement data before the compression without loss.

In addition, the data management system 100 according to this embodiment further includes a data decompression unit which decompresses the stored measurement data before reducing the data size of the stored measurement data. Thus, according to the data management system, it is possible to always store the measurement data in a losslessly compressed state.

In addition, when the data size of the measurement data is reduced, the data management system 100 according to this embodiment reduces the number of samples of the stored measurement data, or reduces the bit width of the stored measurement data. Thus, according to the data management system 100 of this embodiment, it is possible to selectively delete at least a part of the measurement data in either the time axial direction or the size axial direction according to the characteristics of the measurement data.

In addition, the data management system 100 according to this embodiment reduces the data size of the measurement data in accordance with elapse of the predetermined time. Herein, the predetermined time may be the elapsed time after the measurement data is stored, or the elapsed time after the measurement data has been last accessed. In addition, the predetermined time can be set to a value that is different for each measurement data. Thus, according to the data management system of this embodiment, the capacity required for storage can be reduced preferentially from out-of-date measurement data or the measurement data, which has been not accessed, for each sensor or each period.

In the above description, a case where the data management system 100 reduces the data size to compress the data without leaving the acquired measurement data as it is has been described as an example. However, the invention is not limited thereto.

Figure 8:
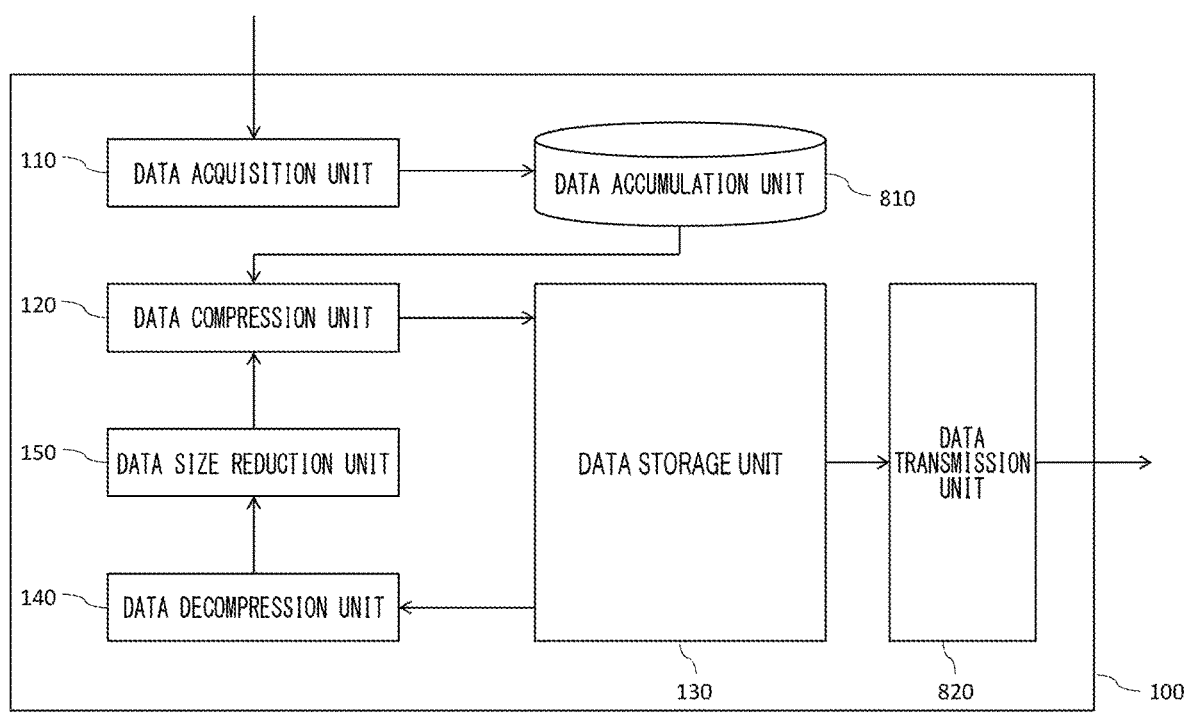
FIG. 8 illustrates an exemplary block diagram of the data management system 100 according to a modification of this embodiment.

FIG. 8 shows an exemplary block diagram of the data management system 100 according to a modification of this embodiment. In FIG. 8, the same symbol is attached to a member having the same function and configuration as those in FIG. 1, and the description will be omitted except for the following differences. The data management system 100 according to this modification may be installed in, for example, the OT region, or may transmit the measurement data, which is acquired from a sensor installed in the OT region, to other systems or devices installed in the IT region. The data management system 100 according to this modification further includes a data accumulation unit 810 and a data transmission unit 820.

In the data management system 100 according to this modification, the data acquisition unit 110 supplies the measurement data acquired from each of the plurality of sensors to the data accumulation unit 810 instead of the data compression unit 120.

The data accumulation unit 810 accumulates the measurement data. As an example, the data accumulation unit 810 may store all the measurement data supplied from the data acquisition unit 110, that is, the raw measurement data as acquired, in a chronological order for each sensor. Then, the data accumulation unit 810 supplies the measurement data which is a transmission target to be transmitted to other systems or devices among the accumulated measurement data to the data compression unit 120. Such a transmission target may be, for example, selected based on a user input, or may be automatically selected by the data management system 100.

Therefore, in the data management system 100 according to this modification, the data compression unit 120 performs data compression on the measurement data which is a transmission target to be transmitted to other systems or device among the measurement data acquired from each of the plurality of sensors, and the data storage unit 130 stores the measurement data. Then, in the data management system 100 according to this modification, decompression, reduction in data size, and data compression are performed with such measurement data which is a transmission target which has been stored in the data storage unit 130.

Then, the data transmission unit 820 transmits the measurement data which has been compressed and stored in the data storage unit 130, that is, the compressed measurement data which is the transmission target, to other systems or devices via a network.

In this way, the data management system 100 according to this modification performs decompression, reduction in data size, and data compression on the measurement data which is the transmission target, while accumulating the raw measurement data as acquired in the data accumulation unit 810, and transmits the compressed measurement data to other systems or devices. Thus, according to the data management system 100 of this modification, for example, when the measurement data is transmitted from the OT region to the IT region, it is possible to reduce the data size to be transmitted from the data management system 100.

Various embodiments of the invention may be described with reference to a flowchart and a block diagram. The block may be (1) a step of the process in which the operation is performed, or (2) a section of a device which serves to execute the operation. The specific step and section may be mounted in a dedicated circuit, which is supplied together with a computer-readable instruction stored on a computer-readable medium, and/or a processor which is supplied together with a computer-readable instruction stored on the computer-readable medium. The dedicated circuit may include a digital and/or analog hardware circuit, or may include an integrated circuit (IC) and/or a discrete circuit. The programmable circuit may include a reconfigurable hardware circuit including a logical AND, a logical OR, a logical XOR, a logical NAND, a logical NOR, memory elements such as other logical operations, flip-flops, registers, field programmable gate arrays (FPGAs), programmable logic arrays (PLAs), and the like.

The computer readable medium may include any tangible device that can store instructions executed by the appropriate device, and as a result, the computer-readable medium having instructions stored in the device includes an instruction that can be executed to create a means for performing the operation designated in a flowchart or block diagram. Examples of the computer-readable medium may include electronic storage medium, magnetic storage medium, optical storage medium, electromagnetic storage medium, semiconductor storage medium, and the like. More specific examples of the computer-readable medium may include floppy (registered trademark) disks, diskettes, hard disks, random access memories (RAM), read-only memories (ROM), erasable programmable read-only memories (EPROM or flash memory), electrically erasable programmable read-only memories (EEPROM), static random access memories (SRAM), compact disk read-only memories (CD-ROM), digital versatile disks (DVD), Blu-ray (registered trademark) disks, memory sticks, integrated circuit cards, and the like.

The computer-readable instructions may include either source code or object code written in any combination of one or more programming languages, including assembler instructions, instruction set architecture (ISA) instructions, machine instructions, machine-dependent instructions, microcode, firmware instructions, state setting data, or object-oriented programming languages such as Smalltalk (registered trademark), JAVA (registered trademark), C++, etc., and traditional procedural programming languages such as "C" programming languages or similar programming languages.

The computer-readable instructions are provided locally or over a wide area network (WAN) such as a local area network (LAN), the Internet, etc., for processors or programmable circuits of general purpose computers, special purpose computers, or other programmable data processors. A computer-readable instruction may be executed to create a means for performing an operation specified in a flowchart or block diagram. Examples of processors include computer processors, processing units, microprocessors, digital signal processors, controllers, microcontrollers, and the like.

Figure 9:
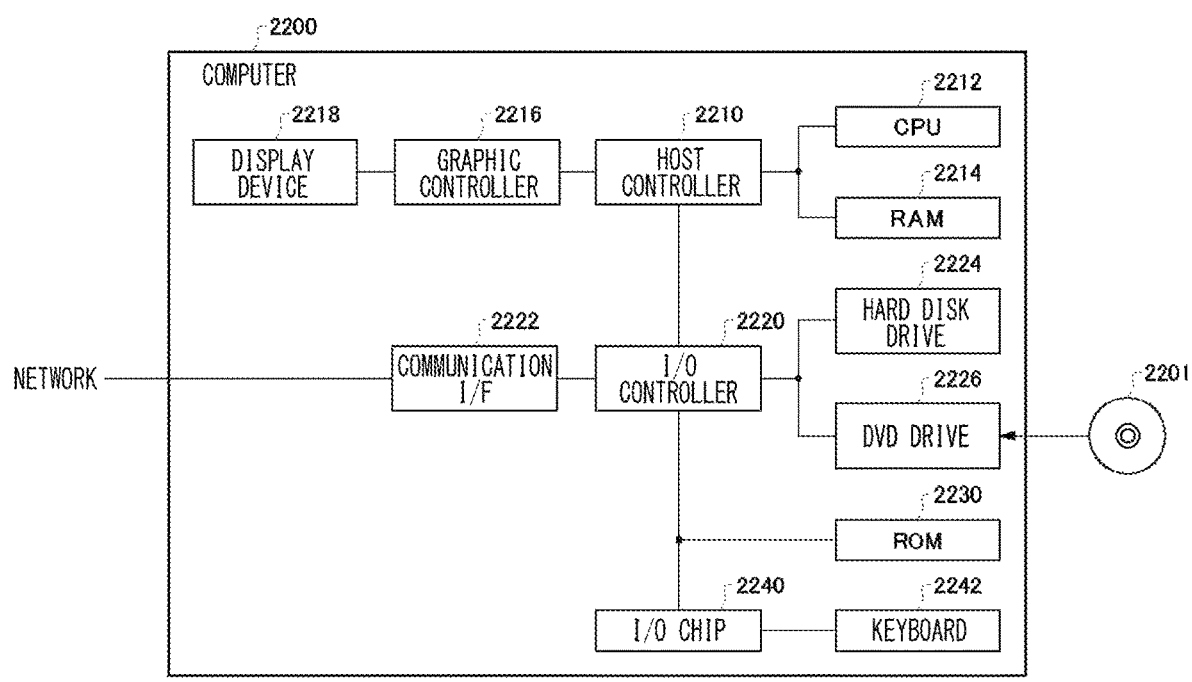
FIG. 9 illustrates a diagram illustrating a computer 2200 in which a plurality of aspects of the invention may be embodied in whole or in part.

FIG. 9 shows an exemplary computer 2200 in which a plurality of embodiments of the present invention may be embodied in whole or in part. A program installed on the computer 2200 can cause the computer 2200 to perform operations associated with the device according to the embodiments of the invention or to function as one or more sections of the device, may cause the computer 2200 to execute the operations or the one or more sections, and/or may cause the computer 2200 to perform the process according to the embodiments of the invention or the steps of the process. Such a program may be executed by a CPU 2212 to have the computer 2200 perform a specific operation associated with some or all of the flowchart and the blocks of the block diagram described in this specification.

The computer 2200 according to this embodiment includes the CPU 2212, a RAM 2214, a graphic controller 2216, and a display device 2218, which are interconnected by a host controller 2210. The computer 2200 also includes input/output units such as a communication interface 2222, a hard disk drive 2224, a DVD-ROM drive 2226, and an IC card drive, which are connected to the host controller 2210 via an input/output controller 2220. The computer also includes a legacy input/output unit such as a ROM 2230 and a keyboard 2242, which are connected to the input/output controller 2220 via an input/output chip 2240.

The CPU 2212 operates according to a program stored in the ROM 2230 and RAM 2214, thereby controlling each unit. The graphic controller 2216 acquires image data generated by the CPU 2212 in a frame buffer or the like provided in the RAM 2214 or itself, so that the image data is displayed on the display device 2218.

The communication interface 2222 communicates with other electronic devices over a network. The hard disk drive 2224 stores programs and data used by the CPU 2212 in the computer 2200. The DVD-ROM drive 2226 reads the program or data from a DVD-ROM 2201 and provides the program or data to the hard disk drive 2224 via the RAM 2214. The IC card drive reads the program and data from the IC card and/or writes the program and data to the IC card.

The ROM 2230 stores in it a boot program or the like executed by the computer 2200 when activated, and/or a program that depends on the hardware of the computer 2200. The input/output chip 2240 may also connect various input/output units to the input/output controller 2220 via a parallel port, serial port, keyboard port, mouse port, or the like.

The program is provided by a computer-readable medium such as the DVD-ROM 2201 or IC card. The program is read from a computer-readable medium, installed on the hard disk drive 2224, the RAM 2214, or the ROM 2230, which are examples of the computer-readable medium, and executed by the CPU 2212. The information processing described in these programs is read on the computer 2200, resulting in cooperation between the program and the various types of hardware resources described above. The device or method may be configured by realizing the operation or processing of information according to the use of the computer 2200.

For example, when communication is performed between the computer 2200 and an external device, the CPU 2212 executes a communication program loaded into the RAM 2214 and may order the communication interface 2222 to perform communication processing based on the processing described in the communication program. Under the control of the CPU 2212, the communication interface 2222 reads the transmission data stored in the transmission buffer processing area provided within a storage medium such as the RAM 2214, hard disk drive 2224, DVD-ROM 2201, or IC card, transmits the read transmission data to the network, or writes reception data received from the network to a reception buffer processing area which is provided on the storage medium.

Further, the CPU 2212 may set all or necessary portions of files or database stored in an external storage medium such as the hard disk drive 2224, the DVD-ROM drive 2226 (DVD-ROM 2201), an IC card, or the like on the RAM 2214, and may perform various types of processing on the data on the RAM 2214. The CPU 2212 then writes back the processed data to the external storage medium.

Various types of information, such as various types of programs, data, tables, and databases, may be stored in the storage medium and processed. The CPU 2212 may perform various types of processing on data read from the RAM 2214 including various types of operations, information processing, conditional determination, conditional branching, unconditional branching, information search/replacement, etc., which are described throughout the present disclosure and designated by an instruction sequence of the program, and the results may be written back to the RAM 2214. Further, the CPU 2212 may search for information in a file, database, or the like in the storage medium. For example, in a case where a plurality of entries with attribute values for a first attribute associated with an attribute value of a second attribute are stored in the storage medium, the CPU 2212 searches an entry that is matched with the condition among the plurality of entries, where the attribute value of the first attribute is specified, reads the attribute value of the second attribute stored in the entry, thereby the attribute value of the second attribute associated with the first attribute that satisfies the predetermined condition may be acquired.

The program or software module described above may be stored on the computer 2200 or in a computer-readable medium near the computer 2200. Further, a storage medium such as a hard disk or RAM provided in a dedicated communication network or a server system connected to the Internet can be used as a computer-readable medium, thereby providing a program to the computer 2200 via a network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 100 data management system
110 data acquisition unit
120 data compression unit
130 data storage unit
140 data decompression unit
150 data size reduction unit
810 data accumulation unit
820 data transmission unit
2200 computer
2201 DVD-ROM
2210 host controller
2212 CPU
2214 RAM
2216 graphic controller
2218 display device
2220 input/output controller
2222 communication interface
2224 hard disk drive
2226 DVD-ROM drive
2230 ROM
2240 input/output chip
2242 keyboard

What is claimed is:

1. A data management system, comprising:
a data acquisition unit configured to acquire measurement data obtained by measuring a measurement target;
a data storage unit configured to store the acquired measurement data;
a data size reduction unit configured to delete at least a part of the stored measurement data to reduce a data size of the measurement data; and
a data compression unit configured to perform data compression on the measurement data reduced in data size.

2. The data management system according to claim 1, wherein the data compression unit is configured to losslessly compress the measurement data reduced in data size.

3. The data management system according to claim 1, further comprising:
a data decompression unit configured to decompress the stored measurement data before reducing a data size of the stored measurement data.

4. The data management system according to claim 2, further comprising:
a data decompression unit configured to decompress the stored measurement data before reducing a data size of the stored measurement data.

5. The data management system according to claim 1, wherein the data size reduction unit is configured to reduce the number of samples of the stored measurement data.

6. The data management system according to claim 2, wherein the data size reduction unit is configured to reduce the number of samples of the stored measurement data.

7. The data management system according to claim 3, wherein the data size reduction unit is configured to reduce the number of samples of the stored measurement data.

8. The data management system according to claim 1, wherein the data size reduction unit is configured to reduce a bit width of the stored measurement data.

9. The data management system according to claim 2, wherein the data size reduction unit is configured to reduce a bit width of the stored measurement data.

10. The data management system according to claim 3, wherein the data size reduction unit is configured to reduce a bit width of the stored measurement data.

11. The data management system according to claim 1, wherein the data size reduction unit is configured to reduce the data size of the measurement data in accordance with elapse of a predetermined time.

12. The data management system according to claim 2, wherein the data size reduction unit is configured to reduce the data size of the measurement data in accordance with elapse of a predetermined time.

13. The data management system according to claim 11, wherein the predetermined time is an elapsed time after the measurement data has been stored.

14. The data management system according to claim 11, wherein the predetermined time is an elapsed time after the measurement data has been last accessed.

15. The data management system according to claim 11, wherein the predetermined time can be set to a value that is different for each measurement data.

16. The data management system according to claim 13, wherein the predetermined time can be set to a value that is different for each measurement data.

17. The data management system according to claim 1, further comprising:
a data transmission unit configured to transmit the measurement data after the data compression to other systems or devices.

18. The data management system according to claim 2, further comprising:
a data transmission unit configured to transmit the measurement data after the data compression to other systems or devices.

19. A data management method, comprising:
acquiring measurement data obtained by measuring a measurement target;
storing the acquired measurement data;
deleting at least a part of the stored measurement data to reduce a data size of the measurement data; and
performing data compression on the measurement data reduced in data size.

20. A storage medium having stored thereon a data management program, wherein the program, when executed by a computer, causes the computer to function as:
a data acquisition unit configured to acquire measurement data obtained by measuring a measurement target;
a data storage unit configured to store the acquired measurement data;
a data size reduction unit configured to delete at least a part of the stored measurement data to reduce a data size of the measurement data; and
a data compression unit configured to perform data compression on the measurement data reduced in data size.

* * * * *